United States Patent
Hsieh et al.

(10) Patent No.: US 6,552,367 B1
(45) Date of Patent: Apr. 22, 2003

(54) HIGH BRIGHTNESS LIGHT EMITTING DIODE HAVING A LAYER OF DISTRIBUTED CONTACTS

(75) Inventors: Min-Hsun Hsieh, Hsinchu (TW); Ming-Jiunn Jou, Chubei (TW); Biing-Jye Lee, Hsinchu (TW)

(73) Assignee: Epistar Corporation, Hsin-Chu (TW)

( * ) Notice: Subject to any disclaimer, the term of this patent is extended or adjusted under 35 U.S.C. 154(b) by 43 days.

(21) Appl. No.: 09/680,416

(22) Filed: Oct. 6, 2000

(30) Foreign Application Priority Data

Oct. 8, 1999 (TW) ........................................ 88117542 A

(51) Int. Cl.[7] .............................................. H01L 33/00
(52) U.S. Cl. ............................. 257/94; 257/95; 257/96; 257/97; 438/22; 438/48
(58) Field of Search .............................. 257/94, 95, 96, 257/97, 98, 99, 103, 13, 22, 79, 85, 90, 91, 12; 438/22, 46, 47, 48

(56) References Cited

U.S. PATENT DOCUMENTS

| | | |
|---|---|---|
| 3,889,286 A | 6/1975 | Debesis |
| 5,789,768 A * | 8/1998 | Lee et al. ..................... 257/96 |
| 5,814,839 A * | 9/1998 | Hosoba ........................ 257/96 |
| 6,057,562 A * | 5/2000 | Lee et al. ..................... 257/96 |

FOREIGN PATENT DOCUMENTS

| | | |
|---|---|---|
| JP | 49-137458 | 11/1974 |
| JP | 50-98796 | 8/1975 |
| JP | 57084188 | 5/1982 |
| JP | 10796602 A | 9/1998 |

\* cited by examiner

*Primary Examiner*—Tom Thomas
*Assistant Examiner*—Donghee Kang
(74) *Attorney, Agent, or Firm*—Winston Hsu

(57) ABSTRACT

A high brightness light emitting diode having a distributed contact area comprising a first electrode; a semiconductor substrate formed on the first electrode; a first cladding layer of a first conductivity type formed on the semiconductor substrate; an active layer formed on the first cladding layer; a second cladding layer of a second conductivity type formed on the active layer; a window layer of a second conductivity type formed on the second cladding layer; a distributed contact area in a predetermined pattern formed on the window layer; a transparent conductive layer formed over the distributed contact area and the window layer, the transparent conductive layer being in ohmic contact with the distributed contact area and a Shottky barrier being formed between the transparent conductive layer and the window layer; and a second electrode formed on the transparent conductive layer.

10 Claims, 3 Drawing Sheets

HIGH BRIGHTNESS LIGHT EMITTING DIODE HAVING A LAYER OF DISTRIBUTED CONTACTS

BACKGROUND OF THE INVENTION a) Technical Field of the Invention

The present invention relates to a light emitting diode, and in particular, to a high brightness light emitting diode.

b) Description of the Related Art

In the U.S. Pat. No. 5,789,768 issued to Biing-Jye LEE et al. and having the same assignee as the present application, a light emitting diode as shown in FIG. 1 is disclosed. In the light emitting diode, an n-type GaAs semiconductor substrate 12 is formed on an n-type back electrode 10. A distributed Bragg reflector (DBR) layer 30 is formed on the semiconductor substrate 12. The distributed Bragg reflector layer 30 preferably comprises a material chosen from the group consisting of AlGaInP and AlGaAs. A stacked structure 14 is formed on the reflector layer 30 and includes a bottom cladding layer of n-type AlGaInP 140, an active layer of AlGaInP 142, and a top cladding layer of p-type AlGaInP 144. A p-type window layer 16 is formed on the top cladding layer 144. The window layer 16 preferably comprises a material chosen from the group consisting of GaP, GaAsP, GaInP, and AlGaAs. A p-type contact layer 17 is formed on the window layer 16. The contact layer 17 preferably comprises a material chosen from the group consisting of GaAsP, GaP, GaInP, and GaAs. A transparent conductive layer 19 is formed on the contact layer 17, extends through the central hollow of the contact layer 17, and contacts with the window layer 16 by forming a Shottky barrier therebetween. The transparent conductive layer 19 preferably comprises a material chosen from the group consisting of indium oxide, tin oxide, indium tin oxide, and the like transparent materials. A p-type front electrode 20 is formed on the conductive layer 19.

The above mentioned prior art light emitting diode is characterized in that the contact surface between the conductive layer 19 and the contact layer 17 is formed into an ohmic contact and the contact surface between the conductive layer 19 and the window layer 17 is formed into a Shottky barrier. Therefore, after the current from the front electrode 20 is spread in the conductive layer 19, it flows into the active layer through the ohmic contact and not through the Shottky barrier before it encounters the current from the back electrode 10 to generate light.

In the prior art light emitting diode, the current portion and the light emitting action directly under the front electrode 20 can be reduced because the current from the front electrode 20 can be controlled to flow through the ohmic contact and not through the Shottky barrier so that the undesired effect of blocking light by the front electrode 20 can be avoided. However, the light generated in the active layer 142 has to pass through the contact layer 17 to emit and the contact layer absorbs about 15% to 20% of the light passing therethrough. Besides, the interface between the contact layer 17 and the window layer 16 also causes an undesired effect of absorbing light. Consequently, if the area on which the contact layer 17 is located over the window layer 16 can reduced, the undesired effect of light absorbing by the contact layer 17 and by the interface between the contact layer 17 and the window layer can be reduced. Thereby, the brightness of the light emitting diode can be increased.

SUMMARY OF THE INVENTION

Therefore, an object of the invention is to provide a high brightness light emitting diode having a distributed contact area to reduce the undesired effect of light absorbing by the contact layer and by the interface between the contact layer and the window layer so that an improved efficacy of increasing the brightness of the light emitting diode can be achieved.

To achieve this object, a high brightness light emitting diode having a distributed contact area comprises a first electrode; a semiconductor substrate formed on the first electrode; a first cladding layer of a first conductivity type formed on the semiconductor substrate; an active layer formed on the first cladding layer; a second cladding layer of a second conductivity type formed on the active layer; a window layer of a second conductivity type formed on the second cladding layer; a distributed contact area in a predetermined pattern formed on the window layer; a transparent conductive layer formed over the distributed contact area and the window layer, the transparent conductive layer being in ohmic contact with the distributed contact area and a Shottky barrier being formed between the transparent conductive layer and the window layer; and a second electrode formed on the transparent conductive layer.

DETAILED DESCRIPTION OF THE PREFERRED EMBODIMENTS

Figure 1:
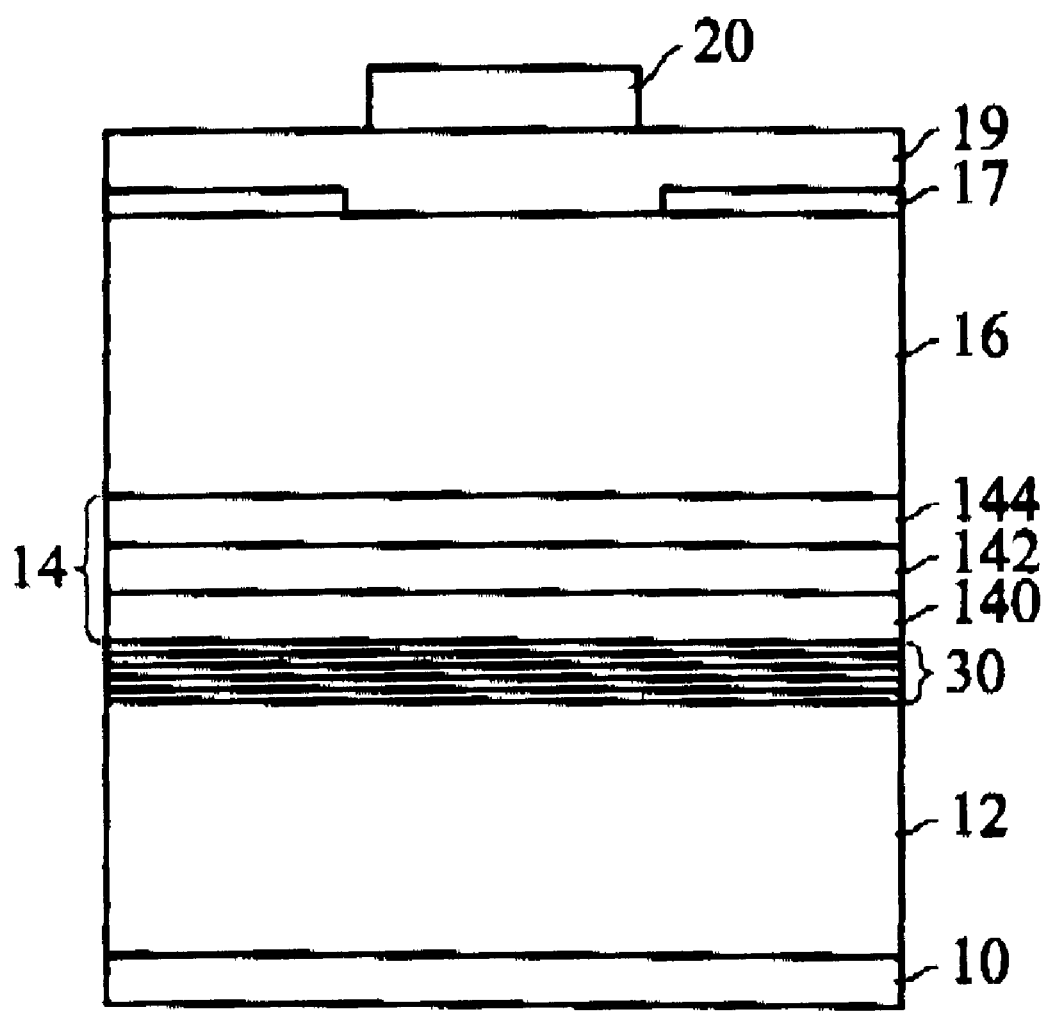
FIG. 1 is a sectional view showing a prior art light emitting diode structure.
Figure 2:
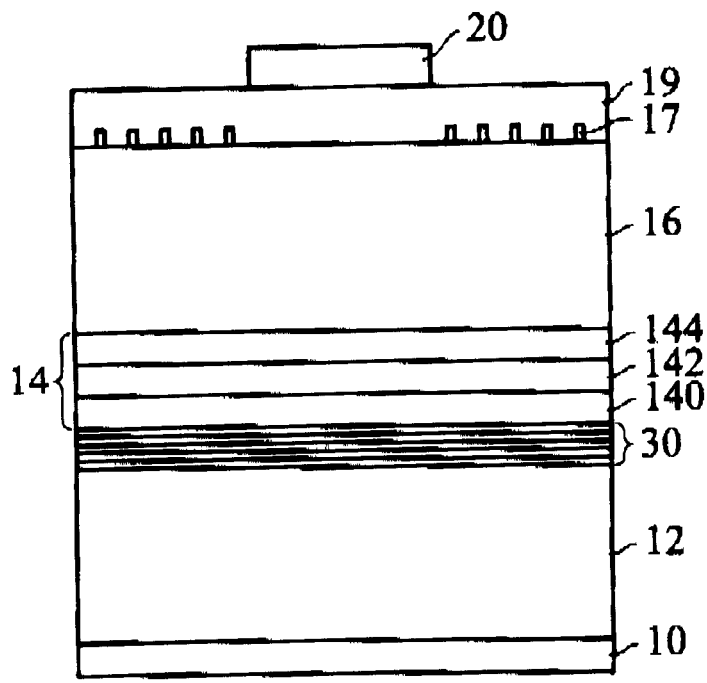
FIG. 2 is a sectional schematic view of a high brightness light emitting diode having a distributed contact area in accordance with the first embodiment of the invention.
Figure 3:
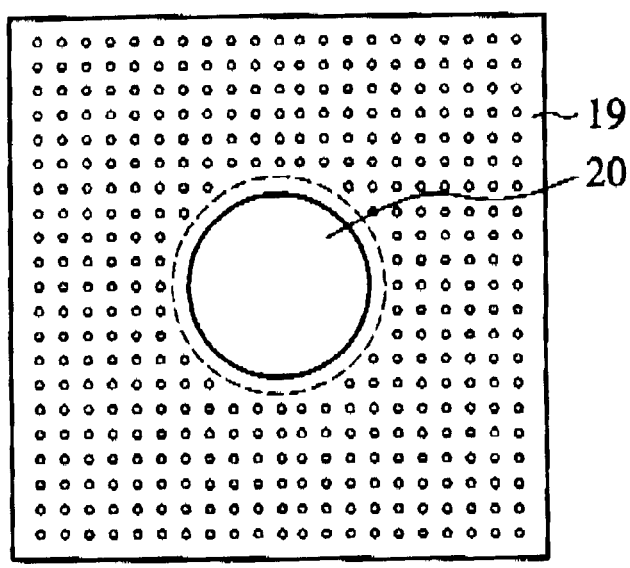
FIG. 3 is a top schematic view of the high brightness light emitting diode having a distributed contact area as shown in FIG. 2.
Figure 4:
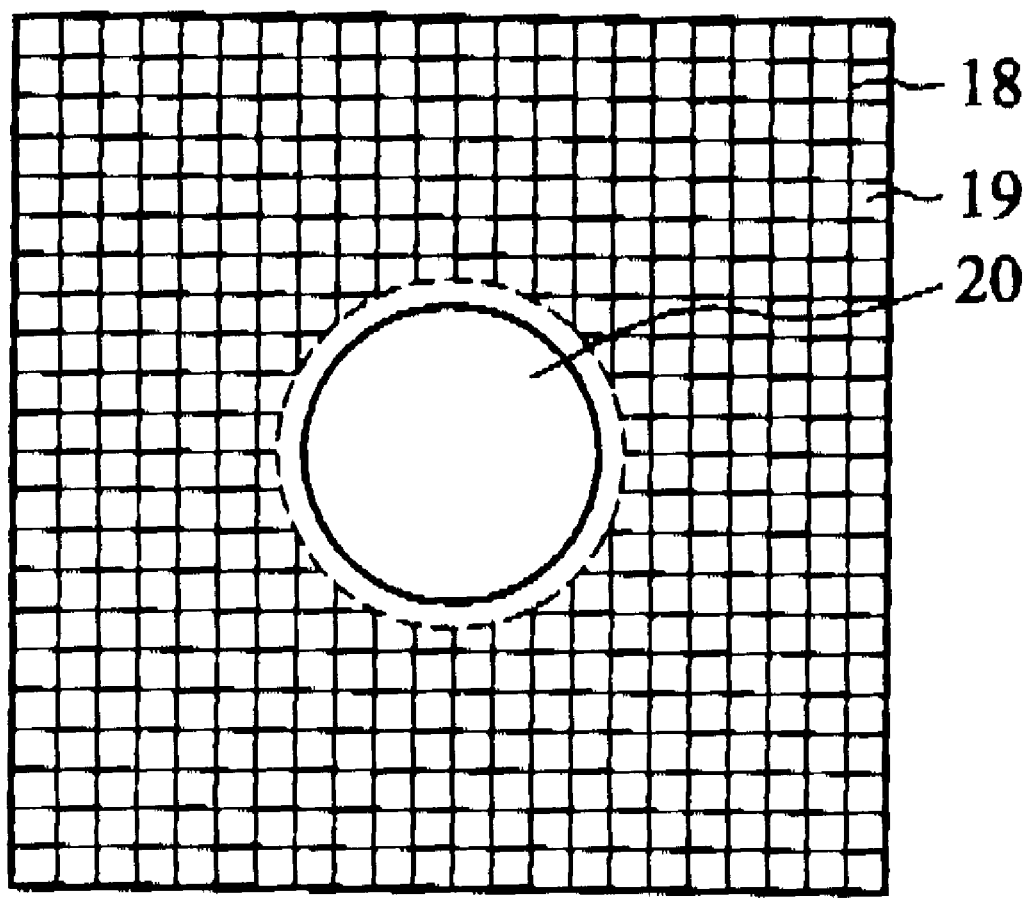
FIG. 4 is a top schematic view of a high brightness light emitting diode having a distributed contact area in accordance with the second embodiment of the invention.

Referring to FIGS. 2 and 3, in a light emitting diode in accordance with the first preferred embodiment of the invention, an n-type GaAs semiconductor substrate 12 is formed on an n-type back electrode 10. A distributed Bragg reflector (DBR) layer 30 is formed on the semiconductor substrate 12. The distributed Bragg reflector layer 30 preferably comprises a material chosen from the group consisting of AlGaInP and AlGaAs. A stacked structure 14 is formed on the reflector layer 30 and includes a bottom cladding layer of n-type AlGaInP 140, an active layer of AlGaInP 142, and a top cladding layer of p-type AlGaInP 144. A p-type window layer 16 is formed on the top cladding layer 144. The window layer 16 preferably comprises a material chosen from the group consisting of GaP, GaAsP, GaInP, AlGaInP, and AlGaAs. As shown in FIG. 3, a p-type contact layer 17 in the form of distributed grains is formed on the window layer 16 except the area directly under the front electrode 20 (to be described hereinafter). The grains of the contact layer 17 preferably comprise a material chosen from the group consisting of GaP, GaAsP, GaInP, and GaAs. In the first embodiment, each of the grains is in the form of a circular cylinder having a diameter of, e.g. about 8 μm and the distance between two adjacent grains is 16 μm. A transparent conductive layer 19 is formed over the grains and over the window layer 16. An ohmic contact is formed between the conductive layer 19 and each of the grains and a Shottky barrier is formed between the conductive layer 19 and the window layer 16. The transparent conductive layer 19 preferably comprises a material chosen from the group consisting of indium tin oxide, indium oxide, tin oxide, zinc oxide, magnesium oxide, and the like transparent materials. A p-type front electrode 20 is formed on the conductive layer 19.

The greater is the ratio between each of the grains and the distance between the two adjacent grains, the better is the conductive effect provided by the grain and the less is the improved light emitting effect. To the contrary, the smaller is the ratio between each of the grains and the distance between the two adjacent grains, the less is the conductive effect provided by the grain and the better is the light emitting effect. Therefore, the ratio is to be selected by considering both the conductive effect and transparent effect of the grains. A desired ratio can be determined by experiments to achieve the optimal light emitting effect of the diode.

Obviously, the undesired light absorbing effect of the contact layer can be decreased by the provision of a contact layer 17 in the form of distributed grains in accordance with the first embodiment of the invention and thereby an efficacy of higher brightness can be achieved.

The embodiment has been reduced to practice by the inventors of the invention and it has been proved that an increase of 15% to 30% of brightness, compared with the prior art light emitting diode, can be achieved by the invention.

While the invention has been disclosed and described with reference to a preferred embodiment, the scope of the invention is not limited to the preferred embodiment. Any variation and modifications of the invention still falls within the spirit and scope of the invention. For example, using a p-type contact layer 18 in the form of distributed cross strips formed on the window layer 16 except the area directly under the front electrode 20 to replace the p-type contact layer 17 in the form of distributed grains in accordance with the first embodiment or letting the p-type contact layer 17 in the form of distributed grains extends to the area directly under the front electrode 20 obviously cannot escape from the scope of the invention.

What is claimed is:

1. A high brightness light emitting diode having a distributed contact area, comprising;
   a first electrode;
   a semiconductor substrate formed on said first electrode;
   a first cladding layer of a first conductivity type formed on said semiconductor substrate;
   an active layer formed on said first cladding layer;
   a second cladding layer of a second conductivity type formed on said active layer;
   a window layer of a second conductivity type formed on said second cladding layer;
   a distributed contact area comprising a plurality of contact grains in the form of circular cylinders formed on said window layer;
   a transparent conductive layer formed over said distributed contact area and said window layer, the transparent conductive layer being in ohmic contact with said distributed contact area and a Shottky barrier being formed between the transparent conductive layer and said window layer; and
   a second electrode formed on said transparent conductive layer.

2. A high brightness light emitting diode having a distributed contact area according to claim 1, wherein said distributed contact area comprises a plurality of contact grains in the form of circular cylinders distributed on said window layer except the area substantially directly under said second electrode.

3. A high brightness light emitting diode having a distributed contact area comprising:
   a first electrode;
   a semiconductor substrate formed on said first electrode;
   a first cladding of a first conductivity type formed on said semiconductor substrate;
   an active layer formed on said first cladding layer;
   a second cladding layer of a second conductivity type formed on said active layer;
   a window layer of a second conductivity type formed on said second cladding layer;
   a distributed contact area comprising a plurality of contact strips formed on said window layer;
   a transparent conductive layer formed over said distributed contact area and said window layer, the transparent conductive layer being in ohmic contact with said distributed contact area and a Shottky barrier being formed between the transparent conductive layer and said window layer; and
   a second electrode formed on said transparent layer.

4. A high brightness light emitting diode having a distributed contact area according to claim 3, wherein said distributed contact area comprises a plurality of contact strips distributed on said window layer except the area substantially directly under said second electrode.

5. A high brightness light emitting diode having a distributed contact area according to claim 3, wherein said active layer comprises AlGaInP, said window layer comprises a material chosen from the group consisting of GaP, GaAsP, GaInP, AlGaInP, and AlGaAs, said distributed contact area comprises a material chosen from the group consisting of GaP, GaAsP, GaInP, and AlGaAs, said transparent conductive layer comprises a material chosen from the group consisting of indium tin oxide, indium oxide, tin oxide, zinc oxide, magnesium oxide, said semiconductor substrate comprises GaAs, said first cladding layer comprises AlGaInP, said second cladding layer comprises AlGaInP, and a distributed Bragg reflector is formed between said semiconductor substrate and said first cladding layer and comprises a material chosen from the group consisting of AlGaInP and AlGaAs.

6. A high brightness light emitting diode having a distributed contact area, comprising:
   a stacked structure for providing a light emitting function and having a first primary surface and a second primary surface;
   a distributed contact area comprising a plurality of contact gains in the form of circular cylinders formed on said first primary surface of said stacked structure, the distributed contact area being in ohmic contact with said stacked structure; and
   a transparent conductive layer formed over said distributed contact area and said first primary surface of said stacked structure, the transparent conductive layer being in ohmic contact with said distributed contact area and a Shottky barrier being formed between the transparent conductive layer and said first primary surface of said stacked structure.

7. A high brightness light emitting diode having a distributed contact area according to claim 6, further comprising:
   a first electrode in electrical communication with said transparent conductive layer; and a second electrode in electrical communication with said second primary surface of said stacked structure.

8. A high brightness light emitting diode having a distributed contact area according to claim 7, wherein said distributed contact area comprises a plurality of contact grains in the form of circular cylinders distributed on said first primary surface except the area substantially directly under said second electrode.

9. A high brightness light emitting diode having a distributed contact area comprising:

a stacked structure for providing a light emitting function and having a first primary surface and a second primary surface;

a distributed contact area comprises a plurality of contact strips formed on said first primary surface of said stacked structure, said distributed contact area being in ohmic contact with said stacked structure; and a transparent conductive layer formed over said distributed contact area and said first primary surface of said stacked structure, the transparent conductive layer being in ohmic contact with said distributed contact area and a Shottky barrier being formed between the transparent conductive layer and said first primary surface of said stacked structure.

10. A high brightness light emitting diode having a distributed contact area according to claim 9, wherein said distributed contact area comprises a plurality of contact strips distributed on said first primary surface except the area substantially directly under said second electrode.

* * * * *